United States Patent
Yeh et al.

(10) Patent No.: US 12,408,497 B2
(45) Date of Patent: Sep. 2, 2025

(54) LIGHT COLOR CONVERSION LAYER STRUCTURE, METHOD OF MANUFACTURING THE SAME AND LIGHT-EMITTING DEVICE CONTAINING THE SAME

(71) Applicant: Industrial Technology Research Institute, Hsinchu (TW)

(72) Inventors: Han-Cheng Yeh, Taipei (TW); Ming-Chang Li, Tainan (TW); Ming-Tzung Wu, Yunlin County (TW); Chin-Cheng Weng, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 524 days.

(21) Appl. No.: 17/976,684

(22) Filed: Oct. 28, 2022

(65) Prior Publication Data

US 2023/0207746 A1 Jun. 29, 2023

(30) Foreign Application Priority Data

Dec. 27, 2021 (TW) .................................. 110148862

(51) Int. Cl.
 *H01L 33/50* (2010.01)
 *H10H 20/851* (2025.01)
(52) U.S. Cl.
 CPC .............................. *H10H 20/8513* (2025.01)
(58) Field of Classification Search
 CPC ............. H01L 51/5256; H01L 27/3272; H01L 27/3246; H01L 51/5234; H01L 27/323;
 (Continued)

(56) References Cited

U.S. PATENT DOCUMENTS 10,481,638 B2   11/2019   Yoshizumi
11,621,305 B2 *  4/2023   Park ..................... H10K 50/858
                                                      257/40
(Continued)

FOREIGN PATENT DOCUMENTS

CN   107068707 A   8/2017
CN   110896121 A   3/2020
(Continued)

OTHER PUBLICATIONS

Taiwan Patent Office, Office Action, Patent Application Serial No. 110148862, Nov. 15, 2022, Taiwan.

*Primary Examiner* — Tracie Y Green (57) ABSTRACT

A light color conversion layer structure includes a pixel separation layer over a substrate. The pixel separation layer includes several separating components. The receiving region over the substrate is defined by adjacent separating components. The light color conversion layer structure also includes a first isolation layer continuously formed over the substrate and on the sidewalls of the separating components surrounding the receiving region. The first isolation layer continuously covers the top surface of the substrate and the sidewalls of the separating components adjacent to the receiving region. The light color conversion layer structure also includes a light color conversion unit within the receiving region and on the first isolation layer. The light color conversion layer structure further includes a second isolation layer on the first isolation layer and the light color conversion unit. The second isolation layer covers the first isolation layer and the light color conversion unit.

18 Claims, 6 Drawing Sheets

(58) Field of Classification Search
CPC ......... H01L 2251/5315; H01L 51/5281; H01L 51/5228; H01L 27/326; H01L 51/5271
See application file for complete search history.

(56) References Cited

U.S. PATENT DOCUMENTS

| | | | |
|---|---|---|---|
| 11,627,646 B2 * | 4/2023 | Lin | ........................ H05B 33/14 427/66 |
| 2017/0104020 A1 * | 4/2017 | Lee | ........................ H10F 39/807 |
| 2021/0175447 A1 | 6/2021 | Ohno et al. | |
| 2024/0251629 A1 * | 7/2024 | Jin | ........................ H10K 59/122 |

FOREIGN PATENT DOCUMENTS

| | | |
|---|---|---|
| CN | 112310300 A | 2/2021 |
| CN | 112631450 A | 4/2021 |
| TW | 201917922 | 5/2019 |
| TW | 201935441 | 9/2019 |
| TW | 201947757 | 12/2019 |
| TW | I683449 | 1/2020 |
| TW | I707491 | 10/2020 |
| WO | WO2019051968 | 3/2019 |
| WO | WO2020181591 | 9/2020 |
| WO | WO2021093280 | 5/2021 |

\* cited by examiner

LIGHT COLOR CONVERSION LAYER STRUCTURE, METHOD OF MANUFACTURING THE SAME AND LIGHT-EMITTING DEVICE CONTAINING THE SAME

CROSS REFERENCE TO RELATED APPLICATIONS

This application claims the benefit of Taiwan Application No. 110148862, filed on Dec. 27, 2021, the disclosure of which is hereby incorporated by reference herein in its entirety.

TECHNICAL FIELD

The technical field relates to a light color conversion layer structure, its manufacturing method and a light-emitting device including the light color conversion layer structure.

BACKGROUND

In recent years, the use of sub-millimeter light-emitting diode (mini LED) light-emitting devices and micro light-emitting diode (micro LED) light-emitting devices have emerged in display panel technology, and both have been receiving a lot of attention in the huge display market. Typical liquid-crystal display (LCD) panels have developed towards the next generation of mini-LED and micro-LED display panels. Compared with the light source used in liquid-crystal display panels, the backlight sources of mini-LED and micro-LED display panels are much smaller, and are arranged in an array. The size of the light-emitting diodes used in a mini-LED display panel is about 100 microns, and the size of the light-emitting diodes used in a micro-LED display panel is less than 100 microns. Using the micro-LED display panel as an example, the backlight source is composed of a high-density, small-sized LED array integrated into the substrate, and each pixel can be controlled and driven by a single micro-LED to emit light. Therefore, compared to the LCD technology already in widespread use, micro-LED display panels offer better contrast, faster response times, and more energy efficiency.

In the light-emitting diode (LED) light-emitting devices currently in use, quantum dot material is also regarded as a key technology for the rapid realization of mini LED and micro LED light-emitting devices. Quantum dots (QDs) are semiconductor nanoparticles, also known as nanocrystals (NC), which are able to perform light color conversion through photoluminescence (PL). Quantum dots can be used in display panels to obtain light color with more saturated color purity, thereby improving the color rendering characteristics of the display panel. However, quantum dot materials can easily become damaged by oxygen and moisture, which degrades their light color conversion properties. Therefore, the development of a protection structure for light color conversion material such as quantum dots is one of the important goals in the industry.

SUMMARY

Some embodiments of the present disclosure provide a light color conversion layer structure. The light color conversion layer structure includes a pixel separation layer over a substrate. The pixel separation layer includes several separating components, and a receiving region over the substrate is defined by adjacent separating components of the pixel separation layer. The light color conversion layer structure includes a first isolation layer continuously formed over the substrate and on the sidewalls of the separating components. In some embodiments, the first isolation layer continuously covers the upper surface of the substrate and the sidewalls of the separating components that are adjacent to the receiving region. The light color conversion layer structure also includes a light color conversion unit disposed within the receiving region and on the first isolation layer. The light color conversion layer structure further includes a second isolation layer disposed on the first isolation layer and the light color conversion unit. In some embodiments, the second isolation layer covers the first isolation layer and the light color conversion unit.

Some embodiments of the present disclosure provide a light-emitting device. The light-emitting device includes a light-emitting component and the aforementioned light color conversion layer structure. The light color conversion layer structure is arranged corresponding to the light-emitting component.

Some embodiments of the present disclosure provide a method of manufacturing a light color conversion layer structure. The method includes providing a substrate; forming a pixel separation layer over the substrate, wherein the pixel separation layer includes several separating components, and a receiving region over the substrate is defined by adjacent separating components; forming a first isolation layer on the substrate and the sidewalls of the separating components, wherein the first isolation layer continuously covers the upper surface of the substrate and the sidewalls of the separating components that are adjacent to the receiving region; forming a light color conversion unit within the receiving region, wherein the light color conversion unit is disposed on the first isolation layer; and forming a second isolation layer on the first isolation layer and the light color conversion unit, wherein the second isolation layer covers the first isolation layer and the light color conversion unit.

A detailed description is given in the following embodiments with reference to the accompanying drawings.

BRIEF DESCRIPTION OF DRAWINGS

The present disclosure can be more fully understood by reading the subsequent detailed description and examples with references made to the accompanying drawings, wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the use of spatially relative terms such as "below", "above", "over", "on", "top", "bottom", "upper", "lower" and other similar terms in the following description is used to simplify a statement of the relationship between one feature and other features as shown in the figure. In addition to the directions depicted in the figures, these spatially relative terms also include different orientations of the structure/device in use or operation. It should be noted that the structure/device may be oriented in other directions and the spatially relative descriptions used herein can be interpreted accordingly.

Furthermore, it should be understood that, although the terms first, second, third, etc., are used herein to describe various elements or parts, these elements or parts should not be limited by these terms. These terms are only used to distinguish one element (/part) from another element (/part). Thus, a first element (/part) in some embodiments could be referred as a second element (/part) in other embodiments without departing from the teachings of the present disclosure.

As used herein, the terms "about", "approximately", "substantially" is generally intended to encompass numbers that are within a reasonable range including the number described, such as within 20%, or within 10%, or within 5%, within 3%, within 2%, within 1%, or within 0.5% of a given value or range. It should be noted that the quantity described in the embodiments is an approximate quantity. That is, without specifically mentioning the terms "about", "approximately", "substantially", etc., those terms are still implied the meaning of "about", "approximately" and "substantially" as understood by person skilled in the art.

Some variations of the embodiments are described below. Similar reference numerals are used to designate similar elements in the different drawings and illustrated embodiments. Still further, it should be noted that additional operations (/steps) can be provided before, during and after the method provided in some embodiments of the present disclosure, and some of the operations (/steps) described can be replaced, eliminated, or moved around in the method for some other embodiments of the present disclosure.

Some embodiments of the present disclosure provide a light color conversion layer structure and a method of manufacturing the same. In some embodiments, the light color conversion layer structure includes a pixel separation layer disposed above a substrate, a first isolation layer continuously formed over the substrate and on the sidewalls of the separating components of the pixel separation layer, a light color conversion unit disposed over the first isolation layer in a receiving region that is defined by the separating components of the pixel separation layer, and a second isolation layer covering the first isolation layer and the light color conversion unit.

In the embodiments of the present disclosure, the first isolation layer and the second isolation layer can be arranged to cover and enclose the light color conversion unit, so as to block penetration of moisture, oxygen and the like from the outside and protect the light color conversion unit from these harmful contaminants. Accordingly, the light color conversion of the light color conversion layer structure in accordance with the embodiments of the present disclosure can be improved, and the high reliability of the light color conversion layer structure can be achieved. In addition, the light color conversion layer structure provided in the embodiments can be implemented in a light-emitting device. The light-emitting device is, for example, a mini light-emitting diode (Mini LED) device, a micro light-emitting diode (micro LED) device, an organic light-emitting diode (OLED) device, or another suitable device.

In the light color conversion layer structure of some embodiments, the light color conversion unit includes quantum dots (QDs). Quantum dots (QDs) are semiconductor nanoparticles, also known as nanocrystals (NC), with good luminescence quantum efficiency and an emission spectrum with a narrow full-width half-maximum (FWHM). A flat panel display panel that is implemented with the photoluminescence (PL) method is able to exhibits colored images with relatively saturated color purity, and consequently the color rendering index (CRI) of the flat panel display panel can be improved. The energy gaps of quantum dots are correlated to the particle sizes of quantum dots. The smaller the particle size of quantum dot, the stronger the confinement effect and the larger the energy gap of quantum dot. That is, the color produced by quantum dots (QDs) is dependent on the particle size. Therefore, quantum dots of the same material but with different particle sizes can produce light of different colors. The particle size of quantum dots can be adjusted through the reaction time of synthesis, thereby changing the light color produced by quantum dots. For example, quantum dots with larger particle sizes may produce red light, while quantum dots with smaller particle sizes may produce blue light. In some embodiment, the light color conversion layer structure that is implemented with quantum dots for producing light by quantum dot color conversion (QDCC) can also be referred to as a quantum dot light color conversion layer structure.

In some embodiments described below, the quantum dot light color conversion layer structure is used as an example of the light color conversion layer structure for the illustration. However, it should be noted that the present disclosure is not limited in these embodiments, and another type of the light color conversion unit can also be implemented in some other embodiments. For example, fluorescent powder can also be implemented in the light color conversion unit, in accordance with some other embodiments.

FIGS. 1A, 1B, 1C and 1D illustrate the cross-sectional views of intermediate stages in a method of manufacturing light color conversion layer structure 10, in accordance with some embodiments of the present disclosure.

Figure 1A:
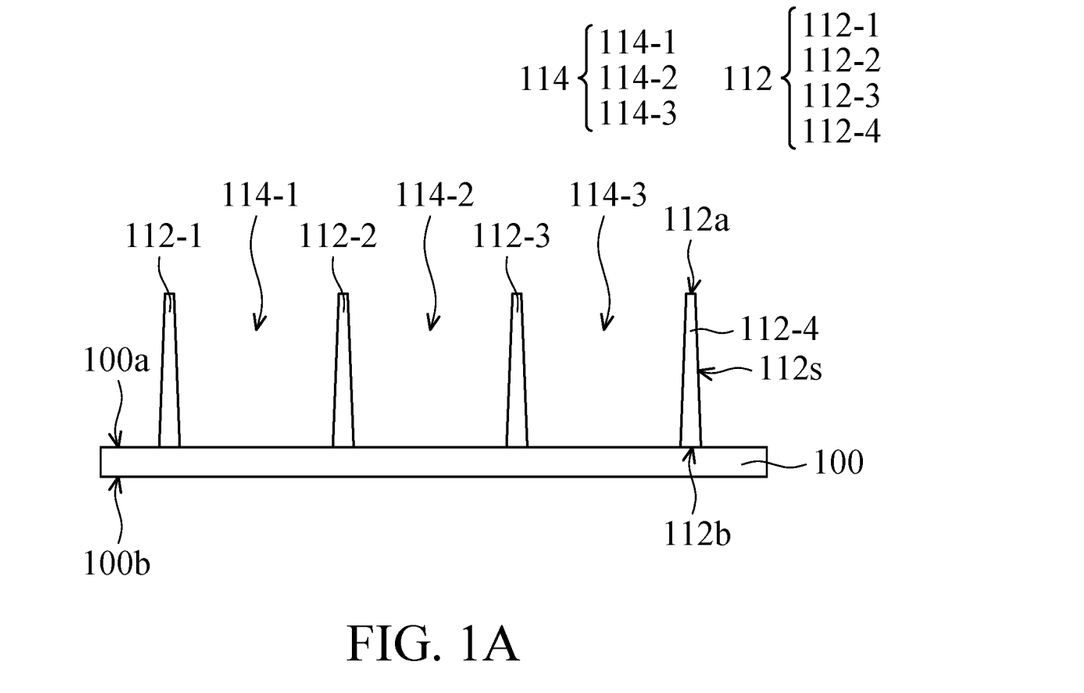
FIGS. 1A, 1B, 1C and 1D illustrate the cross-sectional views of intermediate stages in a method of manufacturing a light color conversion layer structure, in accordance with some embodiments of the present disclosure.

Referring to FIG. 1A, a substrate 100 is provided, and a pixel separation layer 112 is formed over the substrate 100. In FIG. 1, the pixel separation layer 112 includes several separating components, such as the separating components 112-1, 112-2, 112-3 and 112-4 that are formed over the substrate 100. In addition, the receiving regions 114 over the substrate 100 are defined by adjacent separating components of the pixel separation layer 112. For example, some receiving regions 114-1, 114-2 and 114-3 are depicted in FIG. 1A for the illustration.

It should be noted that the cross-sectional views of FIG. 1A-FIG. 1D merely show parts of the separating components surrounding a receiving region 114. Although the cross-sectional views of FIG. 1A-FIG. 1D schematically show two separating components respectively on the left side and the right side of each receiving region 114, there are separating components (not shown in FIG. 1A-FIG. 1D due to cross-sectional location) respectively on the front side and the rear side of each receiving region 114 as viewed from above the substrate 100. The adjacent separating components 112 at the front, rear, left and right sides of each receiving region 114 are connected to each other, and a space with an opening formed above the substrate 100 that are defined by the adjacent separating components 112 serve as a receiving region 114. As shown in FIG. 1A, the receiving region 114-1 is an area enclosed by the left separating component 112-1, the right separating component 112-2, the front separating component (not shown) and adjacent rear separating component (not shown), in accordance with some embodiments of the present disclosure. The receiving region 114-2 is an area enclosed by the left separating component 112-2, the right separating component 112-3, the front separating component (not shown) and adjacent rear separating component (not shown), in accordance with some embodiments of the present disclosure. The receiving region 114-3 is an area enclosed by the left separating component 112-3, the right separating component 112-4, the front separating component (not shown) and adjacent rear separating component (not shown), in accordance with some embodiments of the present disclosure.

In some embodiments, as shown in FIG. 1A, the substrate 100 has an upper surface 100a and a lower surface 100b opposite to the upper surface 100a, and several separating components such as the separating components 112-1, 112-2, 112-3 and 112-4 of the pixel separation layer 112 are disposed on the upper surface 100a of the substrate 100. In some embodiments, the separating components of the pixel separation layer 112 have bottom surfaces 112b and top surfaces 112a opposite to the bottom surfaces 112b. The top surfaces 112a of the separating components 112 are further away from the substrate 100, and the bottom surfaces 112b of the separating components 112 are closer to the substrate 100. In this exemplified embodiment, the bottom surfaces 112b of the separating components 112 are directly disposed on the upper surface 100a of the substrate 100. In addition, the receiving regions 114 (such as the receiving regions 114-1, 114-2 and 114-3) expose portions of the upper surface 100a of the substrate 100 that are not covered by the separating components of the pixel separation layer 112 provided, in accordance with some embodiments of the present disclosure.

In some other embodiments, one or more additional films or material layers are formed below pixel separation layer 112. That is, one or more additional films or material layers are formed between the separating components of the pixel separation layer 112 and the substrate 100. For example, one or more protection layers can be disposed on the upper surface 100a of the substrate 100 to provide a structural buffer and/or one or more light extraction layers can be formed to facilitate light extraction. Then, the pixel separation layer 112 is disposed on the one or more protection layers and/or the one or more light extraction layers. Therefore, the embodiments of the present disclosure does not limit that the bottom surface 112b of the separating components of the pixel separation layer 112 are in direct contact with the upper surface 100a of the substrate 100.

According to some embodiments of the present disclosure, the substrate 100 is a transparent substrate that allows light to pass through the substrate. In some embodiments, the material of the substrate 100 includes poly(methyl methacrylate) (abbreviated to PMMA), polystyrene, polycarbonate, styrene-acrylonitrile copolymer, styrene-methyl methacrylate copolymer, another suitable material or a combination of more of the foregoing materials. In some embodiments, the substrate 100 is a glass substrate or an indium tin oxide (ITO) coated glass substrate. The thickness of the substrate 100 is, for example, but not limited to, 0.2 mm to 2 mm.

According to some embodiments of the present disclosure, the light transmittance of the substrate 100 is greater than or equal to about 90%, such as 90%, 91%, 92%, 93%, 94%, 95%, 96%, 97%, 98%, 99% or 100% %. In addition, the light transmittance of the substrate 100 may have a specific value between the above given values. In some other embodiments, the light transmittance of the substrate 100 is greater than or equal to about 95%. In the interest of brevity, the specific values included in the stated ranges are not exhaustively listed herein.

The pixel separation layer 112 can be made of a material with a high light-shielding (light-blocking) property, so as to avoid light color impurity that is caused by light color mixing from adjacent pixels of the applied light-emitting device. In some embodiments, the pixel separation layer 112 includes a high light-shielding color material, such as a black matrix photoresist, and a high light-shielding matrix pattern can be formed on the substrate 100 to define the aforementioned receiving regions 114. For example, a black photoresist material layer can be formed on the upper surface 100a of the substrate 100 by slit coating, spin coating or another suitable method, and the black photoresist material layer can be pre-baked, patterned to form a black matrix photoresist over the substrate 100. The patterning process includes, for example, exposure, resist development and cure (thermal cure or UV cure). The black matrix photoresist as formed acts as the pixel separation layer 112 with several separating components over the substrate 100.

Figure 1B:
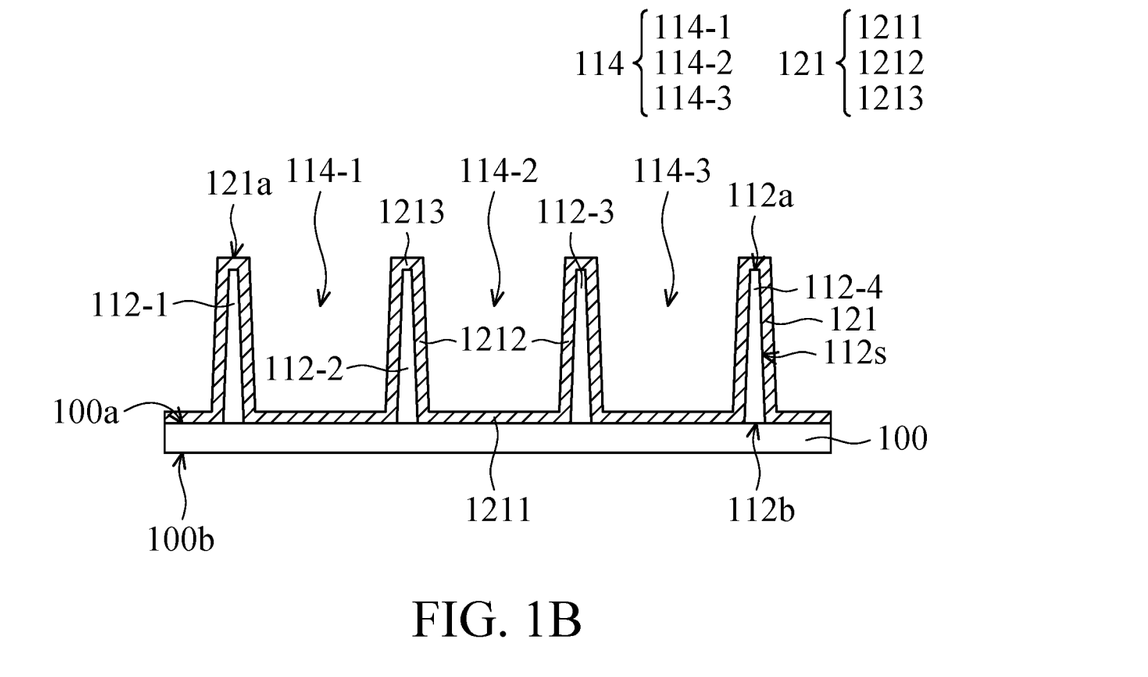

Next, referring to FIG. 1B, in some embodiments, a first isolation layer 121 is formed over the substrate 100 and the pixel isolation layer 112. For example, the first isolation layer 121 is formed on the sidewalls 112s of the separating components 112-1, 112-2, 112-3 and 112-4. In some embodiments, the first isolation layer 121 continuously covers the upper surface 100a of the substrate 100 in the receiving region 114 and the sidewalls 112s of the separating components 112-1, 112-2, 112-3 and 112-4 that are positioned adjacent to the receiving region 114. That is, the first isolation layer 121 that is formed on the upper surface 100a of the substrate 100 and on the sidewalls 112s of the respective separating component 112-1/112-2/112-3/112-4 is a continuous material layer. Also, this continuous first isolation layer 121 can be formed in an integrated form and by an appropriate method. According to some embodiments of the present disclosure, after the first isolation layer 121 is formed, the receiving regions 114-1, 114-2 and 114-3 between the sidewalls 112s of the adjacent separating components 112-1, 112-2, 112-3 and 112-4 are used to accommodate the light color conversion units in the subsequent process. These light color conversion units are arranged corresponding to the pixels of the applied light-emitting device, so that the light-emitting device can generate colored light with a good color purity and color saturation.

In addition, in some embodiments, the first isolation layer 121 is conformably deposited on the substrate 100 and the pixel separation layer 112. As shown in FIG. 1B, in this exemplified embodiment, the first isolation layer 121 continuously covers parts of the upper surface 100a of the substrate 100 that are within the receiving regions 114 and the sidewalls 112s of the separating components 112-1, 112-2, 112-3 and 112-4 adjacent to the receiving regions 114. Also, the first isolation layer 121 continuously extends to the top surfaces 112a of the separating components 112-1, 112-2, 112-3 and 112-4 and covers the top surfaces 112a of these separating components 112-1, 112-2, 112-3 and 112-4. That is, the first isolation layer 121 in this embodiment is a material layer that is integrally formed over the substrate 100 and the separating components 112-1, 112-2, 112-3 and 112-4 by an appropriate deposition method. Accordingly, the first isolation layer 121 can be continuously formed over the substrate 100 to cover the substrate 100 and all exposed surfaces of the separating components 112-1, 112-2, 112-3 and 112-4 of the pixel separation layer 112, in accordance with some embodiments of the present disclosure.

As shown in FIG. 1B, in some embodiments, the first isolation layer 121 can be generally divided into three portions: the first portion 1211, the second portion 1212 and the third portion 1213. In this exemplified embodiment, the first portion 1211 of the first isolation layer 121 covers the upper surface 100a of the substrate 100 in the receiving regions 114. The second portion 1212 of the first isolation layer 121 continuously extends from the first portion 1211 to the sidewalls 112s of the separating components 112-1, 112-2, 112-3 and 112-4 of the pixel separation layer 112. The third portion 1213 of the first isolation layer 121 continuously extends from the second portion 1212 to the top surfaces 112a of the separating components 112-1, 112-2, 112-3 and 112-4 of the pixel separation layer 112.

In some embodiments, the first isolation layer 121 includes aluminum oxide ($Al_2O_3$), molybdenum trioxide ($MoO_3$), silicon dioxide ($SiO_2$), titanium dioxide ($TiO_2$), one or more suitable materials that protect light color conversion units formed in the subsequent process, or a combination of the foregoing materials. In addition, the first isolation layer 121 may be formed by physical vapor deposition (PVD), chemical vapor deposition (CVD) such as atomic layer deposition (ALD), or another suitable method. In some embodiments, the first isolation layer 121 with a high density is formed over the substrate 100 and the pixel separation layer 112 by atomic layer deposition.

In addition, the first isolation layer 121 has a substantially uniform thickness. The thinner the thickness of the first isolation layer 121, the better the light transmittance of the first isolation layer 121. However, the first isolation layer 121 still needs to be thick enough to block moisture and oxygen. In some embodiments, the thickness of the first isolation layer 121 is in a range of about 20 nanometers (nm) to about 100 nanometers (nm). For example, the thickness of the first isolation layer 121 is about 20 nanometers, about 25 nanometers, about 30 nanometers, about 35 nanometers, about 40 nanometers, about 45 nanometers, about 50 nanometers, about 55 nanometers, about 60 nanometers, about 65 nanometers, about 70 nanometers, about 75 nanometers, about 80 nanometers, about 85 nanometers, about 90 nanometers, about 95 nanometers, or about 100 nanometers. In some embodiments, the thickness of the first isolation layer 121 is in a range of about 30 nanometers (nm) to about 60 nanometers (nm).

Figure 1C:
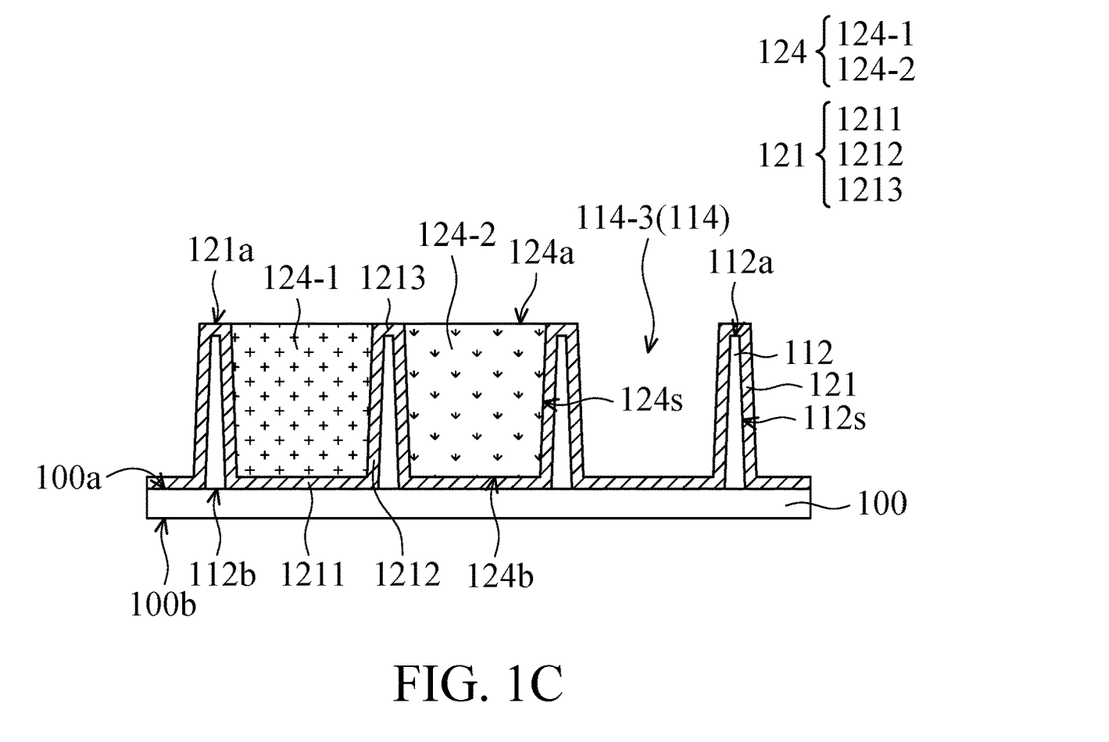

Next, referring to FIG. 1C, in some embodiments, the light color conversion unit 124 is disposed in the receiving region 114, and the light color conversion unit 124 is disposed on the first isolation layer 121. In some embodiments, the light color conversion unit 124 has a first surface 124b and a second surface 124a opposite to the first surface 124b. The first surface 124b of the light color conversion unit 124 is adjacent to the substrate 100, and the second surface 124a of the light color conversion unit 124 is farther from the substrate 100 than the first surface 124b. The light color conversion unit 124 and the substrate 100 are separated by the first isolation layer 121. Specifically, as shown in FIG. 1C, the first surface 124b and all the lateral surfaces 124s of the light color conversion unit 124 are in direct contact with the first isolation layer 121. That is, the first isolation layer 121 of the embodiment completely covers the first surface 124b of the light color conversion unit 124 and all the lateral surfaces 124s adjoining the first surface 124b.

In some embodiments, the light color conversion unit 124 includes quantum dots (QDs). As shown in FIG. 1C, in this exemplified embodiment, the light color conversion unit 124 may include a first quantum dot light color conversion layer 124-1 disposed in the receiving region 114-1 (FIG. 1B) and a second quantum dot light color conversion layer 124-2 disposed in the receiving region 114-2 (FIG. 1B). In addition, there is no light color conversion layer disposed in the receiving region 114-3, in accordance with some embodiments.

The first quantum dot light color conversion layer 124-1 and the second quantum dot light color conversion layer 124-2 may include quantum dots of the same material but with different particle sizes. The particle sizes of quantum dots can be adjusted through the reaction time of synthesis. Light of different colors can be produced by passing blue light through the quantum dots with certain particle sizes. In some embodiments, the particle sizes of the quantum dots are less than 100 nanometers. In some embodiments, the material of the quantum dots includes cadmium selenide (CdSe), indium phosphide (InP), zinc tellurium selenide (ZnTeSe), perovskite, another suitable material, or a combination thereof. In some embodiments, the quantum dots are further coated with a shell material layer. For example, the periphery of the cadmium selenide (CdSe) quantum dot is coated with a layer of zinc sulfide (ZnS) as the shell material layer to protect the cadmium selenide (CdSe) from being damaged by oxygen and moisture. In some embodiments, the quantum dot ink that includes quantum dots with suitable particle sizes can be sprayed in the selected receiving region 114 using an inkjet printing process or another suitable process.

The light color conversion layer structure of the embodiment can be implemented a full-color light-emitting device (such as a full-color flat panel display). In one example, the first quantum dot light color conversion layer 124-1 includes quantum dots with larger particle sizes, and the second quantum dot light color conversion layer 124-2 includes quantum dots with smaller particle sizes. When the light-emitting component of the light-emitting device emits monochromatic light, such as blue light, red light can be produced by passing the blue light through the quantum dots with larger particle sizes in the first quantum dot light color conversion layer 124-1, and green light can be produced by passing the blue light through the quantum dots with smaller particle sizes in the second quantum dot light color conversion layer 124-2. The smaller particle size quantum dots of layer 124-2 can excite green light. In this exemplified embodiment, there is no light color conversion layer disposed in the receiving region 114-3, so that the blue light directly passes through the receiving region 114-3. Accordingly, the light-emitting device implemented with the light color conversion layer structure, in accordance with some embodiments, can produce three colored light, such as red light, green light and blue light.

Figure 1D:
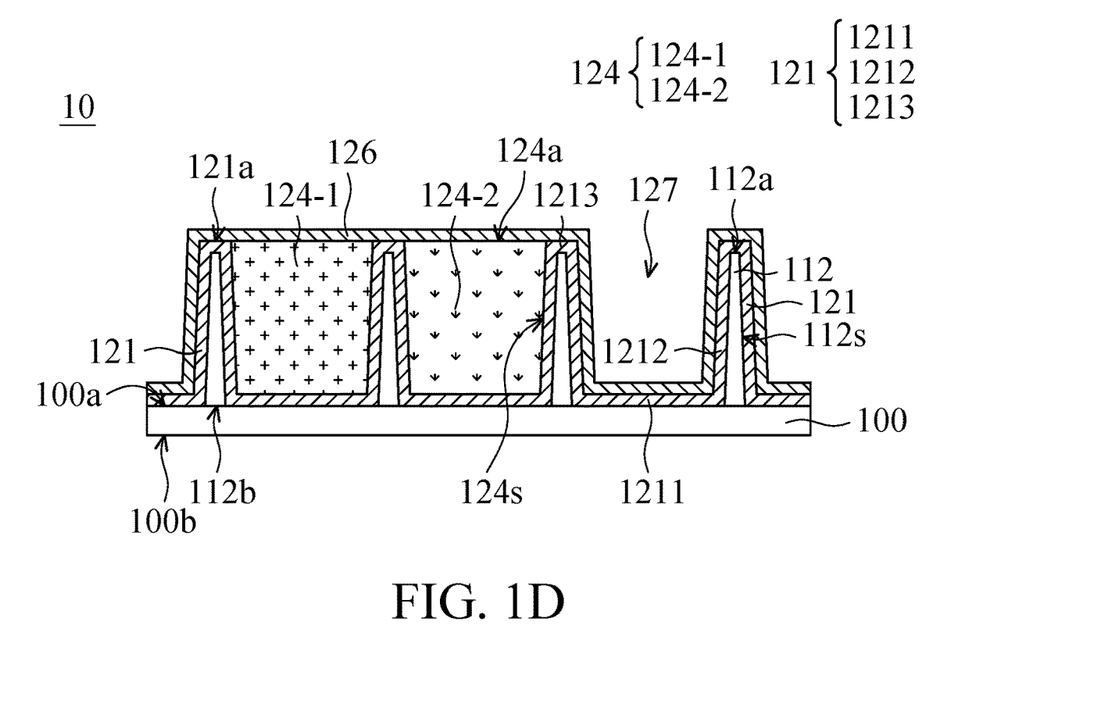

Next, referring to FIG. 1D, in some embodiments, a second isolation layer 126 is formed over the first isolation layer 121 and the light color converting unit 124. The second isolation layer 126 covers the first isolation layer 121 and the light color conversion unit 124, thereby obtaining a light color conversion layer structure 10. Specifically, in this exemplified embodiment, the second isolation layer 126 covers the first quantum dot light color conversion layer 124-1, the second quantum dot light color conversion layer 124-2 and the first isolation layer 121. The second isolation layer 126 further covers a portion of the first isolation layer 121 that is formed in the receiving region 114-3 without setting any quantum dot light color conversion layer. As shown in FIG. 1D, after the second isolation layer 126 is formed, a cavity 127 is created at the corresponding receiving region 114-3.

According to some embodiments, the second isolation layer 126 of the light color conversion layer structure 10 is in direct contact with the light color conversion unit 124 below and covers the second surface 124a of the light color conversion unit 124. After the second isolation layer 126 is formed, all of the surfaces of each light color conversion unit 124 are completely covered by the second isolation layer 126 and the first isolation layer 121 to block moisture and oxygen from affecting the light color conversion units 124 (such as the first quantum dot light color conversion layer 124-1 and the second quantum dot light color conversion layer 124-2), thereby improving the stability of the light color conversion units 124. Accordingly, the light-emitting device implemented with the light color conversion layer structure in accordance with some embodiments has high reliability.

In addition, in some embodiments, as shown in FIG. 1D, the first isolation layer 121 continuously extends to the top surfaces 112a of the separating components 112-1, 112-2, 112-3 and 112-4 and covers the top surfaces 112a of these separating components 112-1, 112-2, 112-3 and 112-4, so that the portions (i.e. the third portions 1213) of the first isolation layer 121 that are disposed on the top surfaces of the separating components 112-1, 112-2, 112-3 and 112-4 have topmost surfaces 121a. The second isolation layer 126 is in direct contact with the topmost surfaces 121a of the portions of the first isolation layer 121, in accordance with some embodiments of the present disclosure.

In some embodiments, as shown in FIG. 1D, the second surface 124a of the light color conversion unit 124 is higher than the top surfaces 112a of the separating components 112-1, 112-2, 112-3 and 112-4. In this example, the second surface 124a of the light color conversion unit 124 is substantially aligned with the topmost surfaces 121a of the first isolation layer 121.

In addition, as shown in FIG. 1D, in this exemplified embodiment, the portion of the first isolation layer 121 and the portion of the second isolation layer 126 are sequentially stacked on each of the top surfaces 112a of the separating components (such as the separating components 112-1, 112-2, 112-3 and 112-4). Therefore, the topmost surfaces 121a of the first isolation layer 121 are not in contact with the substrate 100, the separating components 112-1, 112-2, 112-3 and 112-4 and the light color conversion unit 124.

In some embodiments, the second isolation layer 126 includes aluminum oxide ($Al_2O_3$), molybdenum trioxide ($MoO_3$), silicon dioxide ($SiO_2$), or titanium dioxide ($TiO_2$), one or more suitable materials that protect light color conversion units, or a combination of the foregoing materials. In some embodiments, the first isolation layer 121 and the second isolation layer 126 include the same material. In some other embodiments, the first isolation layer 121 and the second isolation layer 126 include different materials. It should be noted that the present disclosure is not limited to the materials of the first isolation layer 121 and the second isolation layer 126 provided herein.

In some embodiments, the second isolation layer 126 can be formed by physical vapor deposition (PVD), chemical vapor deposition (CVD) such as atomic layer deposition (ALD), or another suitable method. In some embodiments, the second isolation layer 126 is formed on the first isolation layer 121 and the light color conversion unit 124 by atomic layer deposition. In addition, the methods for forming the first isolation layer 121 and the second isolation layer 126 may be the same or different, which are not specifically limited in the present disclosure.

In addition, the second isolation layer 126 has a substantially uniform thickness. The thinner the thickness of the second isolation layer 126, the better the light transmittance of the second isolation layer 126. However, the second isolation layer 126 still needs to be thick enough to block moisture and oxygen from damaging the light color conversion unit 124. In some embodiments, the thickness of the second isolation layer 126 is in a range of about 20 nanometers (nm) to about 100 nanometers (nm). For example, the thickness of the second isolation layer 126 is about 20 nanometers, about 25 nanometers, about 30 nanometers, about 35 nanometers, about 40 nanometers, about 45 nanometers, about 50 nanometers, about 55 nanometers, about 60 nanometers, about 65 nanometers, about 70 nanometers, about 75 nanometers, about 80 nanometers, about 85 nanometers, about 90 nanometers, about 95 nanometers, or about 100 nanometers. In some embodiments, the thickness of the second isolation layer 126 is in a range of about 30 nanometers (nm) to about 60 nanometers (nm). In some embodiments, the first isolation layer 121 and the second isolation layer 126 have the same thickness. In some other embodiments, the first isolation layer 121 and the second isolation layer 126 have different thicknesses. The thicknesses of the first isolation layer 121 and the second isolation layer 126 are not specifically limited in the present disclosure.

Figure 2:
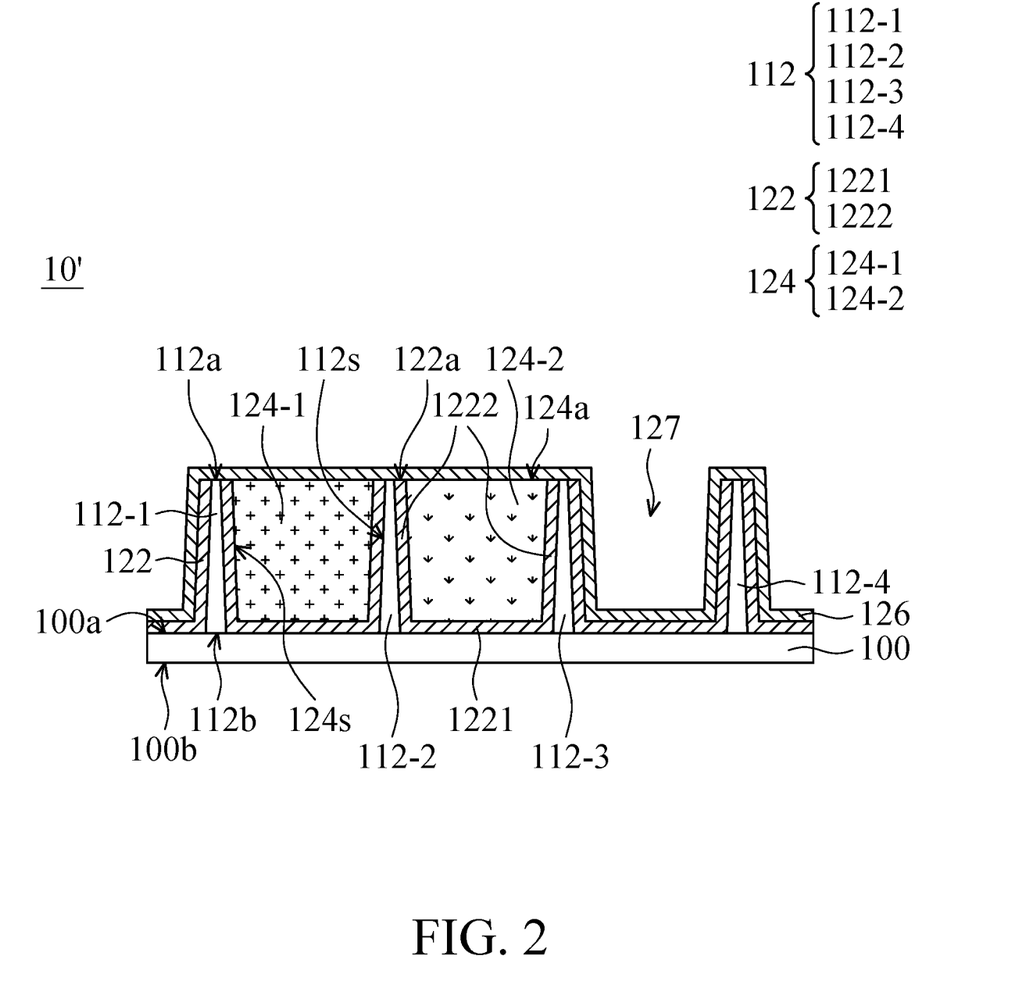
FIG. 2 is a cross-sectional view of another light color conversion layer structure in an intermediate stage, in accordance with some embodiments of the present disclosure.

FIG. 2 is a cross-sectional view of another light color conversion layer structure 10' in an intermediate stage, in accordance with some embodiments of the present disclosure. The components in FIG. 2 that are the same as those in the structure shown in FIG. 1A-FIG. 1D, such as the substrate 100, the pixel separation layer 112 (such as the separating components 112-1, 112-2, 112-3 and 112-4), the light color conversion unit 124 and the second isolation layer 126, use the same reference numerals. The arrangement positions, materials and manufacturing methods of these same components have been described above. For the sake of brevity, detailed descriptions of the positions, materials and manufacturing methods of these same components are not repeated herein.

The main difference between the light color conversion layer structure 10' of FIG. 2 and the light color conversion layer structure 10 of FIG. 1 is arrangement of the first isolation layer 122 (FIG. 2) and the first isolation layer 121 (FIG. 1).

When the thickness of the first isolation layer to be formed is thin, or the separating components (such as the separating components 112-1, 112-2, 112-3 and 112-4) of the pixel separation layer are narrow so that the top surfaces 112a of the separating components are small, it may be difficult to form when depositing the insulating layer material over the substrate 100 and the spacer, it may be difficult to form a portion of the isolation layer having a uniform thickness above the top surfaces 112a of the separating components (such as the separating components 112-1, 112-2, 112-3 and 112-4). It may even be difficult to deposit the isolation material on the top surfaces 112a of the separating components (such as the separating components 112-1, 112-2, 112-3 and 112-4). Therefore, in some embodiments, as shown in FIG. 2, the first isolation layer 122 includes the first portion 1221 and the second portion 1222 connecting to the first portion 1221. The first portion 1221 of the first isolation layer 122 covers the upper surface 100a of the substrate 100 within the receiving region 114. The second portion 1222 of the first isolation layer 122 covers the sidewalls 112s of the separating components adjacent to the receiving regions 114. However, the first isolation layer 122 does not include the portion formed on the top surfaces 112a of the separating components 112-1, 112-2, 112-3 and 112-4. Specifically, in some embodiments, as shown in FIG. 2, the topmost surfaces 122a of the first isolation layer 122 are approximately coplanar with the top surfaces 112a of the separating components 112-1, 112-2, 112-3 and 112-4.

In some embodiments, as shown in FIG. 2, the second surfaces 124a of the light color conversion units 124, the topmost surfaces 122a of the first isolation layer 122 and the top surfaces 112a of the separating components 112-1, 112-2, 112-3 and 112-4 are substantially coplanar with each other. Therefore, the light color conversion layer structure 10' of FIG. 2 is different from the light color conversion layer structure 10 of FIG. 1. In the light color conversion layer structure 10' of FIG. 2, the second isolation layer 126 that covers the first isolation layer 122 and the light color conversion unit 124 is in direct contact with and covers the top surfaces 112a of the separating components 112-1, 112-2, 112-3 and 112-4.

However, whether the light color conversion layer structure 10 of FIG. 1 or the light color conversion layer structure 10' of FIG. 2 is implemented, the light color conversion unit 124 (for example, the first quantum dot light color conversion layer 124-1 and the second quantum dot light color conversion layer 124-2) are completely covered by the second isolation layer 126 and the first isolation layer 121/122, so as to block moisture and oxygen from affecting the light color conversion unit 124. In some embodiments, as shown in FIG. 2, the first isolation layer 122 covers the first surfaces 124b of the light color conversion units 124 and all of the lateral surfaces 124s connected to the first surfaces 124b, while the second isolation 126 covers the second surfaces 124a of the light color conversion units 124, the topmost surfaces 122a of the first isolation layer 122 and the top surfaces 112a of the separating components 112-1, 112-2, 112-3 and 112-4.

Figure 3:
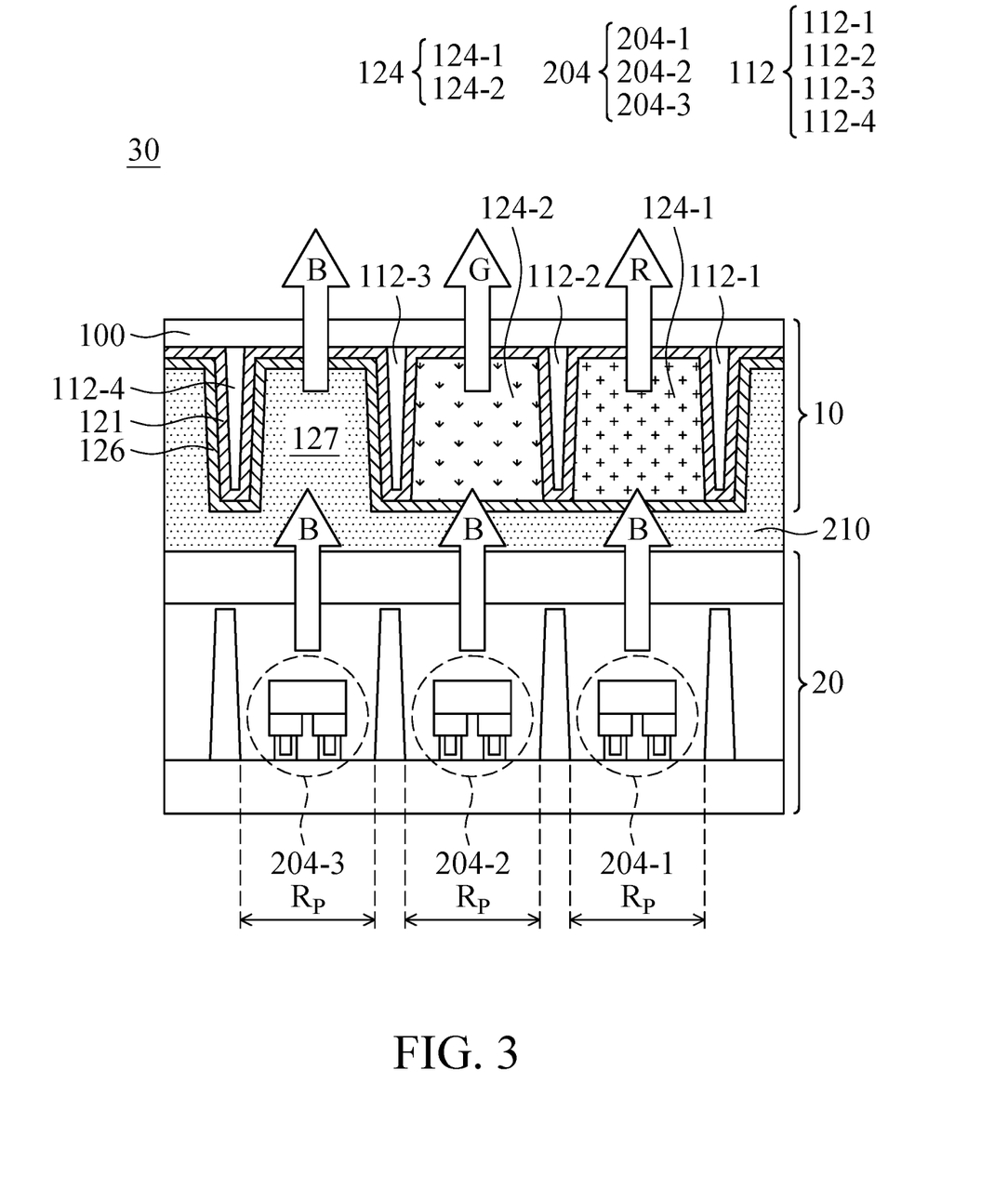
FIG. 3 is a schematic diagram of a light-emitting device implemented with the light color conversion layer structure, in accordance with some embodiments of the present disclosure.

FIG. 3 is a schematic diagram of a light-emitting device implemented with the light color conversion layer structure, in accordance with some embodiments of the present disclosure. In some embodiments, the light-emitting device 30 includes a light-emitting layer 20 and a light color conversion layer structure 10 that is assembled to the light-emitting layer 20. The light-emitting layer 20 includes, for example, sub-millimeter light-emitting diodes (Mini LEDs), micro light-emitting diodes (micro LEDs), organic light-emitting diodes (OLEDs), or another suitable light-emitting components.

In FIG. 3, the light color conversion layer structure 10 of FIG. 1D is implemented in the light-emitting device for the illustration. However, the present disclosure is not limited to the configuration of the light color conversion layer structure 10 of FIG. 1D. In addition, the light-emitting device may include other components. For example, the light color conversion layer structure 10 may further include color filters (CF) that are matched with the light color conversion units 124 to improve color purity of light. Also, the light color conversion layer structure 10 may further include other structural supporters, frames, and so on. For simplicity of the drawings, some other components that are disposed inside the light-emitting device of FIG. 3 are omitted.

In some embodiments, the light color conversion layer structure 10 and the light-emitting layer 20 can be assembled to each other by applying suitable adhesive (such as optical clear adhesive; OCA) and pressed in a vacuum laminating machine, thereby forming the light-emitting device 30. In this example, the light-emitting layer 20 includes several light-emitting components 204-1, 204-2 and 204-3 (or the light-emitting components 204 for short) corresponding to the light color conversion units 124 and the cavity 127 in the light color conversion layer structure 10. The light color conversion units 124 of the light color conversion layer structure 10 include, for example, quantum dots. After the light emitted by the light-emitting components 204 passes through the quantum dots, the light color can be converted, so that the light-emitting device 30 can obtain light color with more saturated color purity.

The light-emitting components 204 are, for example, blue light-emitting diodes or other suitable light-emitting components. In some embodiments, the single-color blue light-emitting diodes are used as the light-emitting components 204. A full-color light-emitting device (such as a full-color flat display panel) 30 can be obtained by cooperating the blue light-emitting diodes with quantum dots that can excite red light and green light. In some embodiments of the present disclosure, the use of monochromatic sub-millimeter light-emitting diodes (Mini LED) and micro light-emitting diodes (micro LED) can reduce process difficulty and cost.

As shown in FIG. 3, the light-emitting components 204-1, 204-2 and 204-3 in the pixel regions $R_P$ of the light-emitting layer 20 are arranged corresponding to the first quantum dot light color conversion layer 124-1, the second quantum dot light color conversion layer 124-2 and the cavity 127. In this exemplified embodiment, the first quantum dot light color conversion layer 124-1 includes quantum dots with larger particle sizes. When the blue light B emitted by the light-emitting component 204-1 passes through the first quantum dot light color conversion layer 124-1, red light R can be excited. The second quantum dot light color conversion layer 124-2 includes quantum dots with smaller particle sizes. When the blue light B emitted by the light-emitting component 204-2 passes through the second quantum dot light color conversion layer 124-2, green light G can be excited. In this exemplified embodiment, there is no light color conversion unit 124 (such as a quantum dot light color conversion layer) in the cavity 127. The blue light B emitted by the light-emitting component 204-3 directly passes through the first isolation layer 121 and the second isolation layer 126 of the embodiment, and the blue light color does not change. Accordingly, the full-color light-emitting device (such as a full-color flat display panel) 30 can be obtained.

According to the light color conversion layer structure provided in some embodiments of the present disclosure, the light color conversion units 124 (such as units including quantum dots) are disposed in the receiving regions defined by the separating components of the pixel separation layer 121, and the pixel separation layer 121 is covered by an isolation layer (such as the aforementioned first isolation layer 121 or 122 of the embodiments). Also, another isolation layer (such as the aforementioned second isolation layer 126 of the embodiments) is disposed on the light color conversion unit 124. Accordingly, the light color conversion unit 124 can be completely covered and enclosed by the isolation layers (such as the aforementioned first isolation layer 121/122 and the second isolation layer 126 of the embodiments). In some embodiments, the isolation layers may be made of a material having a low water vapor transmission rate (WVTR), such as metal oxide or another suitable material. All of the surfaces (including the top surface, the bottom surface and the lateral surfaces) of each light color conversion unit (such as each quantum dot light color conversion layer) block moisture and oxygen from affecting the light color conversion units, thereby improving the stability of the light color conversion units 124. Accordingly, the light-emitting device implemented with the light color conversion layer structure in accordance with some embodiments has high reliability. In addition, the light color conversion layer structure provided in the present disclosure has a simple configuration, and it is easy to realize commercialization in product development, which can improve practicability of the light color conversion units (such as the quantum dot light color conversion layers) implemented in flat display panels.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout. High temperature high and humidity bias test and luminance (/brightness) measurement are conducted to analyze and evaluate the characteristics of the light color conversion layer structures of the exemplary embodiment and two comparative examples.

Figure 4A:
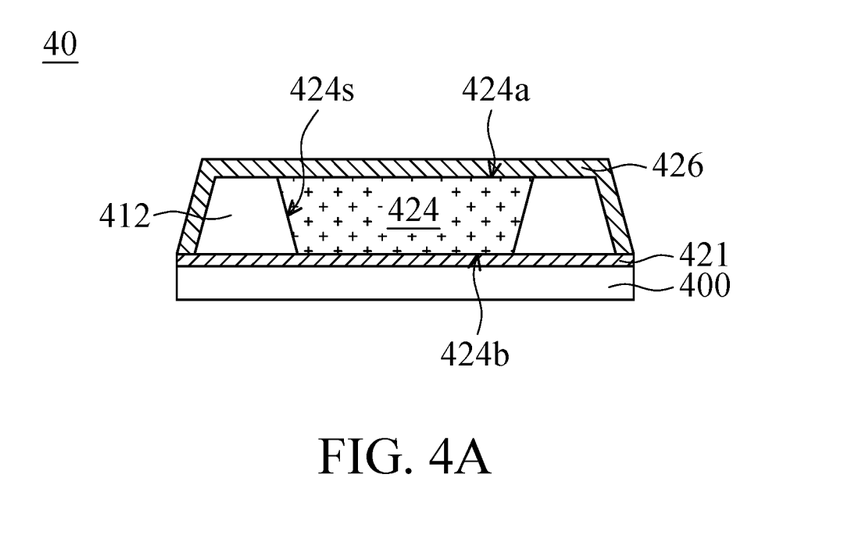
FIG. 4A is a cross-sectional view of a light color conversion layer structure according to the proposed Comparative Example 1.
Figure 4B:
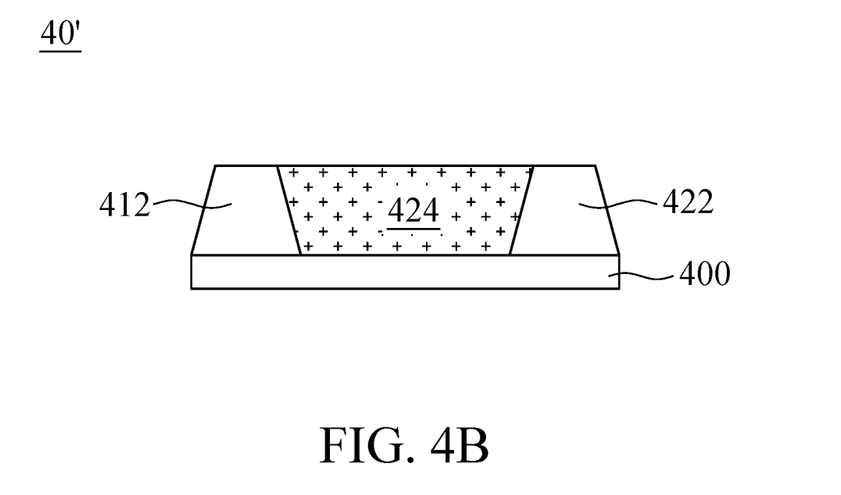
FIG. 4B is a cross-sectional view of a light color conversion layer structure according to the proposed Comparative Example 2.

During experimentation, the light color conversion layer structure 10 depicted in FIG. 1D is provided as an exemplary embodiment in the tests. FIG. 4A is a cross-sectional view of a light color conversion layer structure 40 according to the proposed Comparative Example 1. FIG. 4B is a cross-sectional view of a light color conversion layer structure 40' according to the proposed Comparative Example 2. The components of FIG. 4A and FIG. 4B that are similar to or the same as the components in the structure of FIG. 1A-FIG. 1D use similar or the same reference numerals. For the sake of brevity, detailed descriptions of the positions, materials and manufacturing methods of those similar or the same components are not repeated herein.

As shown in FIG. 4A, the light color conversion layer structure 40 of Comparative Example 1 includes a substrate 400, a bottom isolation layer 421 disposed above the substrate 400, and a pixel isolation layer 412 (also includes several separating components to define receiving regions) disposed above the bottom isolation layer 421. The light color conversion layer structure 40 also includes light color conversion units 424 disposed in the receiving regions that are defined by the pixel separation layer 412. For simplicity of the drawings, one light color conversion unit 424 disposed in the corresponding receiving region is depicted in FIG. 4A. The light color conversion layer structure 40 also includes a top isolation layer 426 that covers the pixel separation layer 412 and the light color conversion units 424.

According to the light color conversion layer structure of the embodiment (for example, the light color conversion layer structure 10 of FIG. 1D), the pixel separation layer 112 is firstly formed, and then the pixel separation layer 112 is formed to cover the first isolation layer 121. The light color conversion units 124 (such as quantum dot light color conversion) are disposed in the regions defined by the pixel separation layer 112 that is covered and protected by an isolation layer. Compared to the light color conversion layer structure of the embodiment (FIG. 1D), the lateral surfaces of the light color conversion unit 424 of Comparative Example 1 (FIG. 4A) are not covered by any isolation layer. According to the light color conversion layer structure 40 of Comparative Example 1 (FIG. 4A), the bottom isolation layer 421 is formed first, and then the pixel isolation layer 412 is formed on the bottom isolation layer 421. Therefore, only the upper surface and the lower surface (i.e., the second surface 424a and the first surface 424b) of the light color conversion unit 424 of Comparative Example 1 are covered by the top isolation layer 426 and the bottom isolation layer 421, respectively. The lateral surfaces 424s of the light color conversion unit 424 are not protected by any isolation layer. However, in the light color conversion layer structure 10 of the embodiment, the first isolation layer 121 is a continuous layer. The first isolation layer 121 at least continuously extends to cover the lower surface (i.e., the first surface 124b) and the lateral surfaces 124s of the light color conversion unit 124. Therefore, different from the light color conversion layer structure 40 of Comparative Example 1 (FIG. 4A), all of the surfaces of the light color conversion unit 124 of the light color conversion layer structure 10 (FIG. 1D), in accordance with some embodiments of the present disclosure, are completely covered by the isolation layers (such as the first isolation layer 121 and the second isolation layer 126).

As shown in FIG. 4B, the light color conversion layer structure 40' of Comparative Example 2 includes a substrate 400 and a pixel isolation layer 412 (also includes several separating components to define receiving regions) disposed above the substrate 400. The light color conversion layer structure 40 also includes light color conversion units 424 disposed in the receiving regions that are defined by the pixel separation layer 412. For simplicity of the drawings, one light color conversion unit 424 disposed in the corresponding receiving region is depicted in FIG. 4B. In the light color conversion layer structure 40' of Comparative Example 2, the upper surface, the lower surface and the lateral surfaces of the light color conversion unit 424 are not covered by any isolation layer.

One of the methods of manufacturing the light color conversion layer structure 10 that includes the quantum dot light color conversion layers of the embodiment is provided to illustrate the preparation of one of the light color conversion layer structures of the embodiment. However, the following steps are only provided to illustrate one of the preparation processes of the light color conversion layer structure, and those contents are not intended to limit the scope of the present disclosure.

Step (1)

First, a pixel separation material such as photoresist was spin coated on a transparent substrate (glass having a thickness of 0.7 mm). After the transparent substrate on which the pixel separation material was formed is soft baked for 2 minutes at a temperature of 100° C., UV exposure was performed on the pixel separation material (such as photoresist), wherein the UV exposure energy was in a range of about 50 mJ/cm$^2$ to about 100 mJ/cm$^2$. Next, the pixel separation material (such as photoresist) was developed with a solution of potassium hydroxide (KOH), and then cured by hard baking at a temperature of about 220° C. for 30 minutes to complete the fabrication of the pixel separation layer.

Step (2)

Next, the transparent substrate on which the pixel separation material was formed and cured was placed into an atomic layer deposition (ALD) reaction chamber, and the deposition of aluminum oxide ($Al_2O_3$) was performed to carry out the fabrication of the first isolation layer, in accordance with some embodiments. The deposition time was about 1 hour and the deposition temperature was about 90° C. The thickness of the deposited aluminum oxide ($Al_2O_3$) was about 33 nm.

Step (3)

The pixel separation layer deposited with the first isolation layer (aluminum oxide ($Al_2O_3$)) was sprayed with quantum dot ink (including quantum dots with suitable particle sizes) to fill the receiving regions (defined by the pixel separation layer) using an inkjet printing process. Then, UV exposure was performed, wherein the UV energy was in a range of about 300 mJ/cm$^2$ to about 400 mJ/cm$^2$. The fabrication of the quantum dot light color conversion layers was completed.

Step (4)

Next, the transparent substrate on which the pixel separation layer, the first isolation layer and the quantum dot light color conversion layers were formed was placed into the atomic layer deposition (ALD) reaction chamber. Deposition of aluminum oxide ($Al_2O_3$) was performed to carry out the fabrication of the second isolation layer, in accordance with some embodiments. The deposition time was about 1 hour and the deposition temperature was about 90° C. The thickness of the deposited aluminum oxide ($Al_2O_3$) was about 33 nm.

Fabrication of the light color conversion layer structure 40 of Comparative Example 1 (FIG. 4A) can be conducted by steps that are similar to the ones in the fabrication method described above. First, a transparent substrate (glass having a thickness of 0.7 mm) was provided, and an aluminum oxide ($Al_2O_3$) layer was deposited on the transparent substrate by an atomic layer deposition (ALD) method. The deposition time was about 1 hour and the deposition temperature was about 90° C. The thickness of the deposited aluminum oxide ($Al_2O_3$) that acted as the bottom insulating layer 421 was about 33 nm. Then, the pixel separation layer 412 and the quantum dot light color conversion layers 424 were formed on the bottom insulating layer 421. After the pixel separation layer 412 and the quantum dot light color conversion layers 424 were formed, another aluminum oxide ($Al_2O_3$) layer was deposited by an atomic layer deposition (ALD) method. The deposition time was about 1 hour and the deposition temperature was about 90° C. The thickness of the deposited aluminum oxide ($Al_2O_3$) that acted as the top isolation layer 426 was about 33 nm.

High temperature and high humidity bias test was conducted first. The prepared light color conversion layer structure 10 in accordance with some embodiments, the prepared light color conversion layer structure 40 of the comparative example 1 and the prepared light color conversion layer structure 40' of the comparative example 2 were placed into a high temperature and high humidity equipment (at a temperature of 60° C. and a relative humidity of 90%). Then, each light color conversion layer structure (10/40/40') placed in the high temperature and high humidity equipment was taken out at different times, and placed above the blue light source. The luminance (/brightness) (nit) of the blue light that passes through each light color conversion layer structure (10/40/40') was measured using the PR-655 spectrophotometer/colorimeter. The measurement results are listed in Table 1.

In addition, the luminance (/brightness) of the blue light that passes each light color conversion layer structure (10/40/40') measured before being placed into the high temperature and high humidity equipment is determined as an initial luminance (/brightness) value. The luminance percentages (%) of each light color conversion layer structure (10/40/40') can be calculated according to the represented equation (1), and the results are listed in Table 1. The luminance decay rates (%) of each light color conversion layer structure (10/40/40') can be calculated according to the represented equation (2), and the results are also listed in Table 1.

Luminance percentage (%)=(measured brightness value/initial brightness value)×100%  (1)

Luminance decay rate (%)=100(%)−Luminance percentage (%)  (2)

TABLE 1

| | | Times (hours) | | | | | | | | | |
|---|---|---|---|---|---|---|---|---|---|---|---|
| | | 0 | 2 | 4 | 6 | 24 | 48 | 72 | 96 | 168 | 216 | 360 |
| Exemplary Embodiment | Luminance (nit) | 345 | 344 | 345 | 344 | 346 | 345 | 346 | 342 | 340 | 335 | 330 |
| | Luminance percentage (%) | 100 | 99.7 | 100 | 99.7 | 100 | 100 | 100 | 99.1 | 98.6 | 97.1 | 95.7 |
| | Luminance decay rate (%) | 0 | 0.3 | 0 | 0.3 | 0 | 0 | 0 | 0.9 | 1.4 | 2.9 | 4.3 |
| Comparative Example 1 | Luminance (nit) | 285 | 280 | 275 | 270 | 267 | 265 | 261 | 258 | 253 | 238 | 220 |
| | Luminance percentage (%) | 100 | 98.2 | 96.5 | 94.7 | 93.6 | 92.9 | 91.6 | 90.5 | 88.8 | 83.5 | 77.2 |
| | Luminance decay rate (%) | 0 | 1.8 | 3.5 | 5.3 | 6.4 | 7.1 | 8.4 | 9.5 | 11.2 | 16.5 | 22.8 |
| Comparative Example 2 | Luminance (nit) | 318 | 261 | 237 | 230 | 192 | 176 | — | — | — | — | — |
| | Luminance percentage (%) | 100 | 82.0 | 74.5 | 72.3 | 60.4 | 55.3 | — | — | — | — | — |
| | Luminance decay rate (%) | 0 | 18 | 25.5 | 27.7 | 39.6 | 44.7 | — | — | — | — | — |

Figure 5:
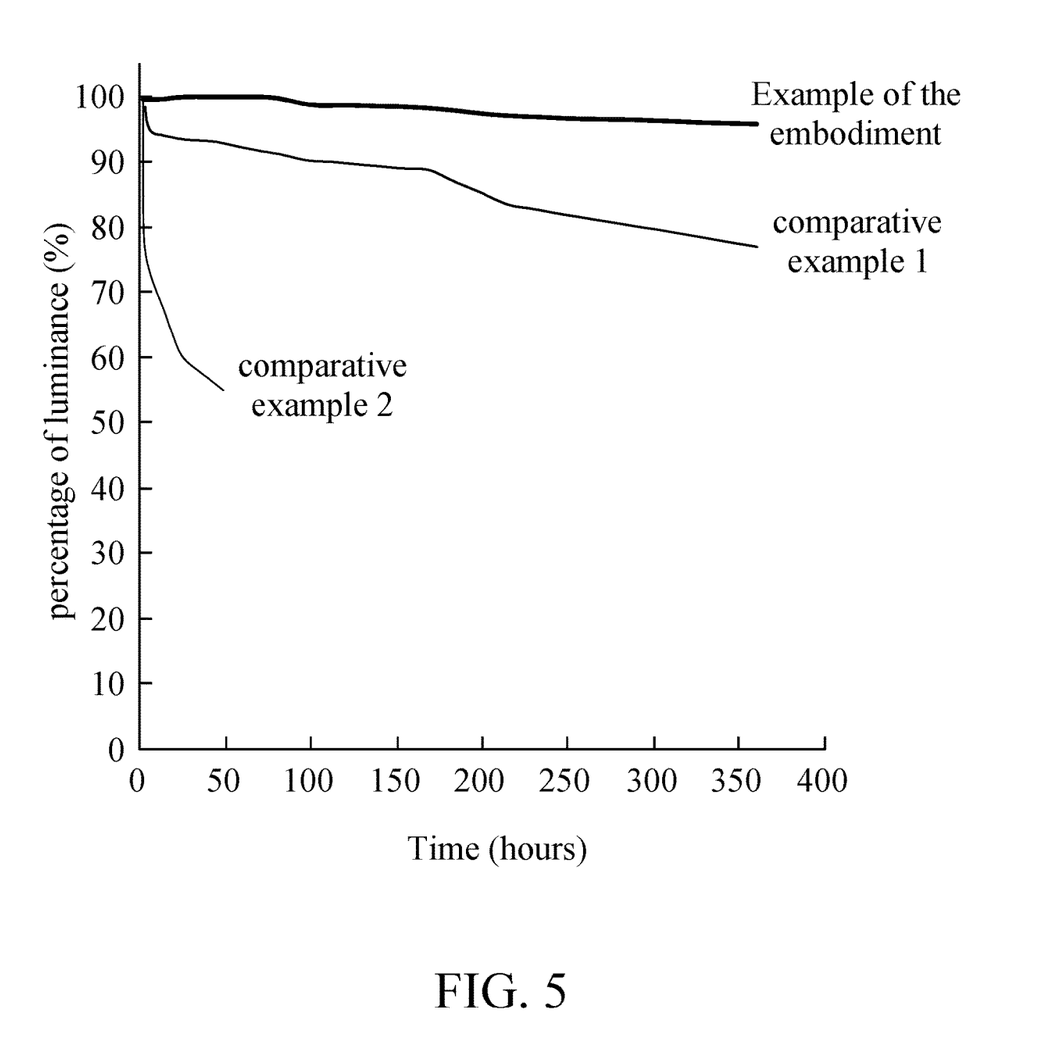
FIG. 5 is a schematic diagram showing that the changes of luminance percentage with time of the light color conversion layer structures of the embodiment, Comparative Example 1 and Comparative Example 2.

FIG. 5 is a schematic diagram showing that the changes of luminance percentage with time of the light color conversion layer structure 10 of the embodiment, the light color conversion layer structure 40 of Comparative Example 1 and the light color conversion layer structure 40' of Comparative Example 2. Please refer to the results of Table 1 and FIG. 5. According to the results of the high temperature and high humidity bias test, the luminance (/brightness) of the light color conversion layer structure 40' (FIG. 4B) of Comparative Example 2 had obviously declined by about 18% after the light color conversion layer structure 40' was placed in the high temperature and high humidity equipment for 2 hours, since there is no isolation layer covering the light color conversion unit 424. The luminance (/brightness) of the light color conversion layer structure 40' (FIG. 4B) of Comparative Example 2 had further declined by about 28% after the light color conversion layer structure 40' was placed in the high temperature and high humidity equipment for 6 hours. Also, the luminance (/brightness) of the light color conversion layer structure 40' (FIG. 4B) of Comparative Example 2 had greatly declined by about 45% after the light color conversion layer structure 40' was placed in the high temperature and high humidity equipment for 48 hours. Therefore, the light color conversion unit 424 without protection of the isolation layer is easily affected by moisture, water vapor and oxygen, and its light color conversion characteristics would be greatly damaged. In addition, the light color conversion layer structure 40' (FIG. 4B) of Comparative Example 2 can no longer perform the light color conversion characteristic after it was placed in the high temperature and high humidity equipment for 60 hours. Therefore, there is no need to perform the high temperature and high humidity test of 72 hours, 96 hours, 168 hours, 216 hours and 360 hours, and the luminance (/brightness) measurements at those test times are no longer necessary to be carried out.

Compare the test results of the light color conversion layer structures of the Example of the embodiment (FIG. 1D) and Comparative Example 1 (FIG. 4A). According to the test results in Table 1, the light color conversion layer structure 10 of the embodiment still maintains the same luminance (/brightness) as the initial luminance (/brightness) after it was placed in the high-temperature and high humidity equipment for 72 hours. That is, the luminance (/brightness) of the light color conversion layer structure of the embodiment did not decline at all after three days thermal and moisture shock. On the other hand, the light color conversion layer structure 40 of Comparative Example 1 exhibited a luminance decay rate of about 5.3% after it was placed in the high temperature and high humidity equipment for 6 hours, and reached a luminance decay rate of about 8.4% after it was placed for 72 hours.

In addition, according to the test results of the experimental structures that are continuously placed in the high temperature and high humidity equipment for 96 hours (4 days), the light color conversion layer structure 10 of the embodiment exhibited a luminance decay rate of about 0.9%, while the light color conversion layer structure 40 of Comparative Example 1 reached a luminance decay rate of about 9.5%. That is, the degree of luminance (/brightness) degradation of the light color conversion layer structure of Comparative Example 1 is about 10.56 times that of the light color conversion layer structure of the embodiment. Therefore, the light color conversion layer structure 10 of the embodiment includes the light color conversion unit that is completely covered and enclosed by the isolation layers (such as the first isolation layer 121/122 and the second isolation layer 126), and this configuration can effectively prevent moisture and oxygen from reaching and damaging the light color conversion unit, thereby greatly reducing the influence on its light color conversion characteristics.

In addition, according to the test results (Table 1) of the experimental structures that are continuously placed in the high temperature and high humidity equipment for 360 hours (15 days), the light color conversion layer structure 10 of the embodiment exhibited a luminance decay rate of about 4.3%, while the light color conversion layer structure 40 of Comparative Example 1 had up to a luminance decay rate of about 22.8%. Therefore, under the condition of high temperature and high humidity for a long time, the light color conversion layer structure 10 of the embodiment does have a good isolation property to block moisture and oxygen, which can effectively prevent moisture and oxygen from damaging the light color conversion unit. Accordingly, the stability of the light color conversion characteristics of the light color conversion unit can be greatly improved, in accordance with the light color conversion layer structure of some embodiments of the present disclosure.

According to the aforementioned experiments, the results in Table 1 have indicated that the light color conversion unit enclosed by the isolation layers can effectively prevent moisture and oxygen from damaging the light color conversion unit. According to the light color conversion layer structure 10 (FIG. 1D) of the embodiment, all of the surfaces of the light color conversion unit (such as the quantum dot light color conversion layer) 124 are covered by the isolation layers. That is, if the light color conversion unit 124 is a trapezoidal prism, the six surfaces (the upper surface, the lower surfaces and four lateral surfaces) of the light color conversion unit 124 are all covered by the isolation layers. In the light color conversion layer structure 40 (FIG. 4A) of Comparative Example 1, only the upper surface and the lower surface of the light color conversion unit (such as the quantum dot light color conversion layer) 424 are covered by the isolation layers. After the light color conversion layer structures were placed in a high temperature and high humidity environment for 96 hours, the degree of luminance (/brightness) degradation of the light color conversion layer structure 40 (FIG. 4A) of Comparative Example 1 is about 10 times that of the light color conversion layer structure 10 of the embodiment. Therefore, all of the surfaces (for example, the six surfaces) of the light color conversion unit of the light color conversion layer structure 10, in accordance with some embodiments of the present disclosure, are completely covered by the isolation layers, thereby greatly improving the effect of blocking moisture and oxygen. Therefore, the light color conversion unit of the light color conversion layer structure, in accordance with some embodiments of the present disclosure, has excellent light color conversion properties.

According to the aforementioned light color conversion layer structure of some embodiments, the pixel separation layer is formed on the substrate, and the first isolation layer is then formed over the substrate and the pixel separation layer. Next, the light color conversion unit (such as the quantum dot light color conversion layer) is formed in the receiving region defined by the pixel separation layer, and then the second isolation layer is disposed on the light color conversion unit. Accordingly, all surfaces of the light color conversion unit are covered by the first isolation layer and the second isolation layer, thereby effectively preventing moisture and oxygen from reaching and damaging the light color conversion unit. Thus, the effect of moisture and oxygen on the light color conversion characteristics of the light color conversion unit can be greatly reduced, and the reliability of the light color conversion layer structure of the embodiments can be significantly improved. Thus, when a light-emitting device is implemented with the light color conversion layer structure of the embodiments, the stability of light color conversion characteristics of the light color conversion unit can be greatly improved. Accordingly, the light-emitting device that is implemented with the light color conversion layer structure of the embodiments can exhibits colored images with relatively saturated color purity, and the color gamut standard of the light-emitting device in color display, such as National Television System Committee (NTSC) color gamut standard, can be greatly improved. In addition, the light color conversion layer structure in accordance with some embodiments of the present disclosure is easy to fabricate and has a simple configuration.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A light color conversion layer structure, comprising:
   a pixel separation layer over a substrate, wherein the pixel separation layer comprises separating components, and a receiving region over the substrate is defined by adjacent separating components of the pixel separation layer;
   a first isolation layer continuously formed over the substrate and on sidewalls of the separating components, wherein the first isolation layer continuously covers an upper surface of the substrate and the sidewalls of the separating components that are adjacent to the receiving region;
   a light color conversion unit disposed within the receiving region and on the first isolation layer; and
   a second isolation layer disposed on the first isolation layer and the light color conversion unit, wherein the second isolation layer covers the first isolation layer and the light color conversion unit.

2. The light color conversion layer structure as claimed in claim 1, wherein the first isolation layer and the second isolation layer cover all surfaces of the light color conversion unit.

3. The light color conversion layer structure as claimed in claim 1, wherein the light color conversion unit has a first surface adjacent to the substrate, and the first surface and all lateral surfaces of the light color conversion unit are in direct contact with the first isolation layer.

4. The light color conversion layer structure as claimed in claim 3, wherein the light color conversion unit has a second surface opposite to the first surface, the second surface is farther from the substrate than the first surface, and the second surface is in contact with the second isolation layer.

5. The light color conversion layer structure as claimed in claim 1, wherein the light color conversion unit and the substrate are separated by the continuous first isolation layer, and the light color conversion unit and the separating components are also separated by the continuous first isolation layer.

6. The light color conversion layer structure as claimed in claim 1, wherein the separating components have bottom surfaces and top surfaces opposite to the bottom surfaces, the bottom surfaces of the separating components are closer to the substrate, the top surfaces of the separating components are further away from the substrate, and the second isolation layer covers the top surfaces of the separating components.

7. The light color conversion layer structure as claimed in claim 1, wherein the separating components have bottom surfaces and top surfaces opposite to the bottom surfaces, the bottom surfaces of the separating components are closer to the substrate, the top surfaces of the separating components are further away from the substrate, and the first isolation layer further extends to cover the top surfaces of the separating components.

8. The light color conversion layer structure as claimed in claim 7, wherein portions of the first isolation layer that are disposed on the top surfaces of the separating components have topmost surfaces, the topmost surfaces of the first isolation layer are not in direct contact with the substrate, the separating components and the light color conversion unit, and the second isolation layer is in direct contact with the topmost surfaces of the portions of the first isolation layer.

9. The light color conversion layer structure as claimed in claim 7, wherein the portions of the first isolation layer and portions of the second isolation layer are sequentially stacked on the top surfaces of the separating components.

10. The light color conversion layer structure as claimed in claim 1, wherein the first isolation layer and the second isolation layer include aluminum oxide ($Al_2O_3$), molybdenum trioxide ($MoO_3$), silicon dioxide ($SiO_2$), or titanium dioxide ($TiO_2$).

11. The light color conversion layer structure as claimed in claim 1, wherein each of the first isolation layer and the second isolation layer has a thickness in a range of about 20 nm to about 100 nm.

12. The light color conversion layer structure as claimed in claim 1, wherein the light color conversion unit includes quantum dots (QDs).

13. A light-emitting device, comprising:
    a light-emitting component; and
    the light color conversion layer structure of claim 1;
    wherein the light color conversion layer structure is arranged corresponding to the light-emitting component.

14. The light-emitting device as claimed in claim 13, wherein the light-emitting component is a blue light-emitting diode.

15. A method of manufacturing a light color conversion layer structure, comprising:
    providing a substrate;
    forming a pixel separation layer over the substrate, wherein the pixel separation layer comprises separating components, and a receiving region over the substrate is defined by adjacent separating components;
    forming a first isolation layer on the substrate and sidewalls of the separating components, wherein the first isolation layer continuously covers an upper surface of the substrate and the sidewalls of the separating components that are adjacent to the receiving region;
    forming a light color conversion unit within the receiving region, wherein the light color conversion unit is disposed on the first isolation layer; and
    forming a second isolation layer on the first isolation layer and the light color conversion unit, wherein the second isolation layer covers the first isolation layer and the light color conversion unit.

16. The method of manufacturing a light color conversion layer structure as claimed in claim 15, wherein the first isolation layer is a continuous layer in an integrated form.

17. The method of manufacturing a light color conversion layer structure as claimed in claim 15, wherein the first isolation layer and the second isolation layer cover all surfaces of the light color conversion unit after the second isolation layer is formed.

18. The method of manufacturing a light color conversion layer structure as claimed in claim 15, wherein the light color conversion unit has a first surface, a second surface opposite to the first surface and lateral surfaces adjoining the first surface and the second surface, wherein the second surface is farther from the substrate than the first surface, wherein the first surface and all of the lateral surfaces of the light color conversion unit are in direct contact with the first isolation layer after the light color conversion unit is formed.

* * * * *